United States Patent [19]

Wall et al.

[11] 3,800,412

[45] Apr. 2, 1974

[54] PROCESS FOR PRODUCING SURFACE-ORIENTED SEMICONDUCTING DEVICES

[75] Inventors: Ernst L. Wall, Woburn; Walter K. Niblack, Bedford, both of Mass.

[73] Assignee: Alpha Industries, Inc., Woburn, Mass.

[22] Filed: Apr. 5, 1972

[21] Appl. No.: 238,598

[52] U.S. Cl. ........................ 29/578, 29/580, 156/17, 148/187

[51] Int. Cl. ........................ B01j 17/00

[58] Field of Search ........ 29/578, 580; 317/235 AD; 156/17; 148/187

[56] References Cited

UNITED STATES PATENTS

| | | | |
|---|---|---|---|
| 3,542,551 | 11/1970 | Rice | 29/578 |
| 3,560,278 | 2/1971 | Sanera | 29/578 |
| 3,585,089 | 6/1971 | Preece et al. | 29/578 |
| 3,518,585 | 6/1970 | Wilcox | 317/235 AD |

*Primary Examiner*—W. C. Tupman
*Attorney, Agent, or Firm*—Charles Hieken; Jerry Cohen

[57] ABSTRACT

Surface-oriented diodes are produced by forming respective window areas for N+ and P+ doping in the surface of a semiconductive substrate, the first and second window areas being separated by a coating spacing pattern of uniform width. Diffusion of dopants into the N+ and P+ windows is carried out alternately for the respective window areas with the other window area masked. Similarly, the formation of ohmic contacts may be carried out alternately for the respective window areas, with the other window area masked. The process enables production of surface-oriented diodes on an economically feasible scale, while being tolerant of the realistic limits of photo-alignment precision and registration capabilities of the microcircuit art.

10 Claims, 6 Drawing Figures

PROCESS FOR PRODUCING SURFACE-ORIENTED SEMICONDUCTING DEVICES

BACKGROUND OF THE INVENTION

The present invention relates to the production of surface-oriented semiconducting devices, including diodes. Surface-oriented diodes are a class of semiconductive junction diodes having separate, but closely-spaced, window areas of the surface of a semiconductive substrate doped to N+ and P+ conductivities by diffusion of N and P dopants into the respective window areas. The substrate is generally N and P silicon, but may comprise other semiconductive materials and may be a complete slice or ribbon of the semiconductive material or an epitaxially grown layer of semiconductive material on a ceramic substrate. In producing surface-oriented diodes, a single diode may be produced at the surface of a semiconductive substrate. Alternatively, a staggered alternating array of the N+ and P+ areas, numbering on the order of several hundred to several thousand, can be produced on a surface area on the order of one square inch on a single substrate. After formation of the surface oriented diodes, electrical interconnections can be provided between them thereby forming a circuit matrix of such diodes on the single substrate. Alternatively, the substrate can be diced to produce hundreds of individual surface oriented diodes, which will be subsequently packaged.

It is an important object of the present invention to provide a process for producing surface-oriented diodes with more uniform spacing between the N and P areas, notwithstanding the state of the art limits in photo masking.

It is a further object of the invention to provide a process which is broadly usable in preparing semiconductive devices of the type having closely spaced surface regions of different conductivity with improved uniformity of such spacing.

Uniformity as used herein includes uniformity of width in a given spacing in a device, among several spacing bands in a given device and from production run-to-production run.

SUMMARY OF THE INVENTION

In accordance with the present invention, a multiple layer coated semiconductive substrate is provided. The semiconductive substrate may be a silicon wafer sliced from a Czochralski crystal ingot or punched from a dendritically grown ribbon. Alternatively, the semiconductive substrate can have other compositions including, for instance, gallium arsenide, germanium, gallium phosphide and silicon carbide. The substrate can also have other forms, such as a ceramic wafer with an epitaxially grown layer of the semiconductive material thereon instead of being completely formed of such semiconductive material. The multiple layer coating on the substrate comprises, as a first surface layer at the substrate surface, a first diffusion barrier-which is preferably a thermal conversion oxide product of the semiconductive substrate material. This is overlayed by a second layer of the multiple layer coating which is a refractory material--a high temperature material which is resistant to etchants which can attack the oxide of the semi-conductive material quite readily. This middle coating layer is in turn overlaid by a top protective layer comprising a second diffusion barrier–preferably a pyrolitically deposited oxide of the semiconductive substrate material. In a preferred and distinctly advantageous embodiment of the invention described below, the substrate is a silicon wafer of N or P type, the near layer of the triple coating is thermally produced silicon dioxide the middle of the coating is silicon nitride ($Si_3N_4$), and the top protective coating is silicon dioxide produced by pyrolysis of a silane in oxygen ambient.

Photoresist masking techniques are used to form a window-defining spacing pattern of uniform width on the top protective layer. That is, a photoresist in the desired spacing pattern form--usually a cross-hatch grid of lines--is produced and an etchant is applied to the whole triple coated substrate and it has the effect of etching out desired window areas outside the photoresist-covered spacing pattern. These windows are the areal sites for subsequent N and P doping to produce the N+ and P+ surface areas in the substrate.

No photo-alignment problems are involved to this point, because there is only a single photo masking step involved in defining the respective N+ and P+ window areas and the uniform spacing therebetween. Subsequent photo masking steps have the width of the spacing pattern available for accommodating tolerances of individual photo masking steps and misalignments between separate photo masking steps within the state of the art. Accordingly, the separate individual processing steps for producing the N+ and P+ areas, hereinafter described, do not compromise the uniform spacing between such areas established at this point. Although the process may involve production of hundreds to thousands of alternating windows for N and P diffusion, the present invention also involves production of at least first and second window areas in the top protective layer, separated by the said spacing pattern.

After removing the top protective layer from the window areas, the refractory layer is removed from those window areas.

Then N doping and P doping is accomplished in the window areas by processing as follows:

One of such first and second windows is covered by a photoresist layer to mask it. An etchant is applied to the whole coated substrate and has the effect of removing the first diffusion barrier in the window which is not covered by a photoresist coating (or windows which are not covered by a photoresist coatings.) After removal of the photoresist, doping is applied to the substrate on a whole surface area basis--either by depositing a source of dopants in solid form and heating to diffuse it into the substrate or by directly diffusing in dopant from a gaseous source or by ion-implanting such dopants. Doping into the substrate surface only takes place in the window areas which were not masked by photoresist or other coating, such as protective oxide (dopants diffused into such coatings are removed with such coatings at a later stage of processing). After reoxidation of the surface, either thermally or by a deposition process, the process is then reversed to obtain doping in the alternate window or windows. The depth of doping is a thin layer (less than all the full thickness of the semiconductive substrate) and the effective junction(s) is formed at the semiconductive substrate surface. As an alternative to doping both windows, one or more of the windows can be simply etched and overlaid with an ohmic contact after the other window of a pair is doped.

Finally, ohmic contacts are provided at the windows to thereby form a complete diode device (or an array of complete devices). This can be done in alternating fashion for the respective N+ and P+ areas, as in the respective doping steps, or both sets may be formed simultaneously. The contacts can be built up to form supporting beams and the substrate can be etched away to form a beam lead device.

Electrical interconnections can be provided between the ohmic contacts of the various N+ and P+ pairs on the device to form a circuit matrix or the treated substrate can be diced to form separate diode devices.

A chip having only one N and one P window can be formed in accordance with the present invention. Devices other than diodes can also be formed.

The line width of the spacing pattern accommodates the photographic misalignment problems and the lateral spread of dopants during diffusion. Depending on the requirements of particular surface-oriented devices to be produced, the line width of the surface pattern will typically be from 0.1 to 1 mils, although the actual limit is dependent on the overall device state of the art.

The present process can be summarized as follows. A window-defining spacing pattern is formed at the surface of a semiconductive substrate in the form of a narrow surface band which has a different etch characteristic relative to adjacent first and second surface areas. A mask is formed over one of the first and second window areas and the other one is doped to alter conductivity of the substrate at the doped window. Prior to doping etching is applied and the mask and spacing pattern resist such etching. The masking/etching-doping process is reversed at a later time to achieve doping of the other of the first and second windows. Masking in this fundamental sense can be achieved by a variety of sub-surface treating and surface coating means and as described above, application of a thin refractory band is a preferrable and distinctly advantageous process for implementing this. The refractory band is preferably etched out of a refractory coating covering a broad area encompassing at least the potential band site and portions of the potential window sites adjacent the band. The refractory coating is overcoated with an oxidation resistant coating to protect it from oxidative attack during etch processing. Undercoating the refractory band with an oxide provides window coverings particularly suited for photomask and etch processing and the oxide undercoat can be reformed as often as necessary to accommodate multiple treatments of a given window area for doping and contacting purposes.

Numerous other features, objects and advantages of the invention will become apparent from the following specification when read in conjunction with the accompanying drawings in which:

DETAILED DESCRIPTION OF PREFERRED EMBODIMENTS OF THE INVENTION

Figure 1:
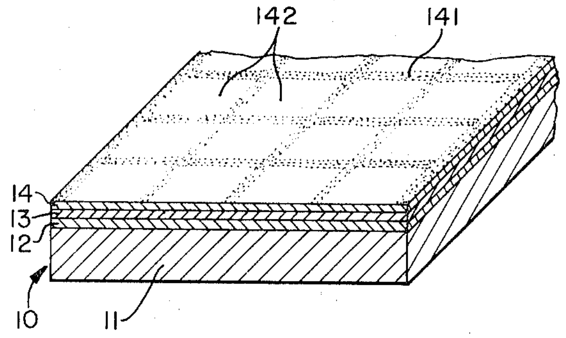
FIGS. 1 – 5 are isometric views with cross sections at the lower end right hand edges of a coated substrate at various stages of treatment in accordance with a preferred embodiment of the process of the invention and FIG. 6 is a partial top view of a second embodiment.

Referring now to FIG. 1 of the drawings, there is shown a partial section of a coated wafer of P or N silicon 10, comprising the silicon wafer 11, a coated layer 12 thereon of silicon dioxide, an overlying second coated layer 13 of silicon nitride and a top protective layer 14 of silicon dioxide. The layer 12 is formed by heating of the substrate 11 in an oxygen environment. Alternatively, it can be formed by vacuum depositing silicon monoxide onto substrate and converting the silicon monoxide to silicon dioxide. This layer should have a thickness of typically 1,000 to 10,000 angstroms thick.

The layer 13 can be produced by preparing a bulk sputtering target of silicon nitride and coating it onto the substrate 11 (with initial coating layer 12) by vapor-coating material transfer processees, known per se. Reactive nitrogen sputtering of silicon can accomplish the result of producing a similar layer, as can the gaseous reaction of ammonia and silane. The layer 13 should typically be in the range of 500 to 1,500 angstroms thickness. While $Si_3N_4$ is preferred, other refractory materials can be used. Examples are, Mo,W-,Ta,Cb,Hf,Zr,V. The refractory layer should have a different etch characteristic compared to the layer 12 or other modification of the substrate surface and should also be compatible with the substrate and resistant to window doping conditions, as hereinafter described.

The layer 14 is produced by pyrolytic reaction of silane and oxygen or pyrolytic decomposition of an organo-silicate, to produce a typical silicon dioxide layer of 1,000 to 5,000 Angstroms thickness. As an alternative to pyrolytic formation, layer 14 can be formed in the known spin-on techniques (spinning on a slurry of $SiO_2$ in an organic carrier, baking off the carrier by heating at 300°–400°C and sintering at about 600°C). The back-out and sinter heats are carried out for half an hour each. Still other known techniques may be used.

A grid of cross-hatched lines 141 is formed on top of the layer 14 in the form of a polymerized photoresist material, such as Eastman Kodak's KTFR or like materials well known in the art which are resistant to certain classes of etching agents. Then the window spaces 142 outside the spacing pattern defined by the crossing lines 141 are etched through the application of etching agents to the coated substrate 10, as a whole.

Figure 2:
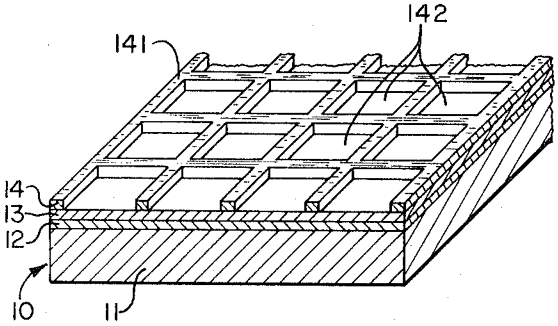

This produces the intermediate product shown in FIG. 2 with windows 142 etched in layer 14 down to refractory layer 13.

Then the refractory layer 13—if it is $Si_3N_4$, as is preferred—is etched in the window area 142 by placing the whole coated substrate 10 in an aqueous orthophosphoric acid solution at a temperature of about 180°C. This solution dissolves $Si_3N_4$ but does not attack silicon dioxide lines 141.

Figure 3:
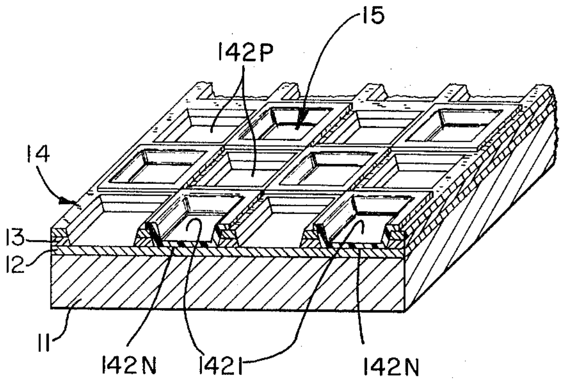

Referring now to FIG. 3, photoresist layers 1421 are applied to windows 142N leaving bar windows 142P corresponding respectively to the windows selected for N type diffusion and P type diffusion. This particular example will be used for the balance of this description of the process of a preferred embodiment of the invention, although it will be understood that the application of photoresist could be made initially to the windows predesignated for P type diffusion. The photoresist is applied in a checkerboard array fashion so that there will be adjacent first and second windows, separated by the oxide lines 141.

The passivating thermal oxide layer 12 is etched from the areas of windows 142P, the etching being carried out on a whole area basis with the photoresist mask(s) 1421 preventing attack of the etchant on the oxide layer 12 at the window areas 142N. Then the photoresist masks 1421 are removed.

The photoresist mask application technique involves the following ancillary steps. The liquid precursor of the photo-resist is applied to the surface of coated wafer 10, as a whole, by spraying or spinning on. The liquid film so applied is dried to a prepolymer solid. A generally ultraviolet transparent mask layer, with selected portions opaque to ultraviolet light–preferably a glass, is applied over the resist layer. The mask is fabricated by known photolithograph techniques which enable the pattern of opaque and transparent areas to be precisely defined. The masked surface of coated wafer 10 is exposed to ultraviolet light. This polymerizes the photoresist layer in those areas under transparent sections of the mask. Then the mask is removed and the wafer is rinsed in a developer solution to wash away portions of the photoresist film which were under opaque regions of the mask. The photopolymerized areas of the resist (which were under transparent areas of the glass layer) do not wash away in the rinsing step. The wafer may then be baked, if necessary, to further polymerize and harden the photoresist mask.

An etchant applied to the masked wafer surface as a whole will not etch the photoresist masked areas to a significant degree but will etch in the unmasked areas.

The etchant used for oxide is preferably an aqueous solution of hydrofluoride acid, typically buffered with ammonium fluoride. The photoresist stripping is done by J-100 or HotH2SO4.

Figure 4:
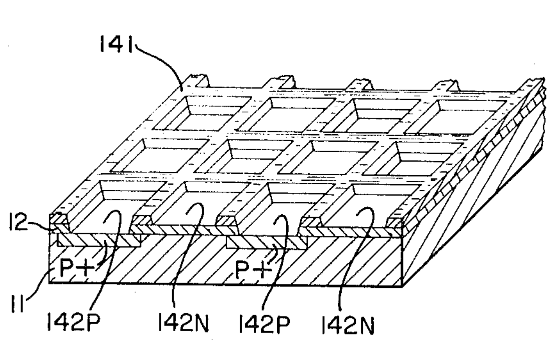

P doping is applied to produce a P+ region at the surface of substrate 11 in the P window areas 142P (FIG. 4). The doping step is done on a whole surface area basis—through any of deposition of a solid source of dopant and in-diffusion, diffusion from a gaseous source of dopant resulting in production of the desired degree of doping in the P windows, but not in the N windows which are covered by thermal oxide. If the refractory band is a metal, it should be protected by overcoating with pyrolytic oxide prior to diffusion.

P+ doping is carried out to produce dopant impurity concentration at the surface of $10^{20}$ atoms/cc or more, for example, to form a junction, typically 1–10 microns below the surface.

The coated substrate 10 is now heated to 900°–100°C in a wet oxygen ambient cause a regrowth of thermal oxidation layer at the P windows 142P. This prepares it for the next step. Alternatively, pyrolytic deposition or quartz sputtering can be used for oxide reforming.

The next steps are photomasking to open the N windows 142N in the same fashion as described above for the P window areas, and doping the N areas with N+ material such as phosphorus or antimony.

Where diffusion doping heating is utilized (or in the case of ion implantation, the subsequent heating to remove surface damage) there is a lateral spread of the N+ and P+ conductivity regions. But the width of the overlying passivating oxide layer of the spacing pattern 141 is sufficient to accommodate this.

Next, the thermal oxide layers in the windows are stripped. Then the refractory layer 13 in the region of lines 141 may be stripped, if necessary. Sripping of the refractory material at lines 141 may be omitted if the refractory material does not involve surface problems for the particular device to be produced.

Figure 5:
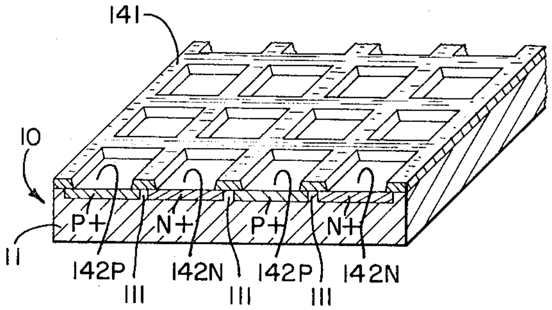

The resultant product, before application of ohmic contacts, is shown in FIG. 5. The wafer 10 comprises the substrate 11 with the uniformly spaced window areas 142N and 142P doped to N+ and P+ conductivities. The spacing 111 between such doped regions is uniform and may be produced to widths as low as 1 micron.

Ohmic contacts are attached in conventional manner.

Figure 6:
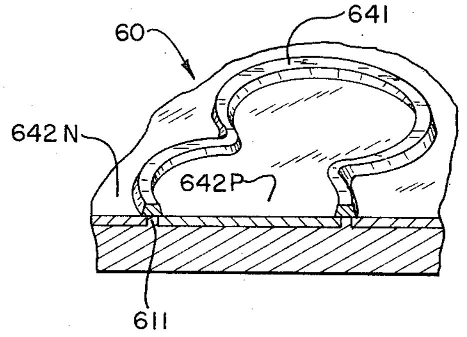

FIG. 6 shows a portion of a semiconductive chip 60 wherein a P doped window 642P is formed within an N doped window 642N, utilizing a window-defining spacing band 641 for processing as described above in connection with FIGS. 1–5 to produce a uniform window spacing 611 at the surface of the semiconductive substrate. The spacing band is given a figure eight form to maximize junction length consistent with minimum P window span requirements. The outer boundary of window N can be formed through similar techniques, other techniques, a chip edge or a combination thereof.

It is evident that those skilled in the art may now make numerous uses and modifications of and departures from the specific embodiments described herein without departing from the inventive concept. Accordingly, the invention is to be construed as embracing each and every novel feature and novel combination of features present in or possessed by the apparatus and techniques and product herein disclosed.

What is claimed is:

1. Process for preparing surface-oriented semiconductive devices of the type having closely spaced surface regions of different conductivities on a semiconductive substrate separated by a line width of 0.1 to 1.0 mils at said surface with improved uniformity of such line width comprising the steps of, coating a semiconductive substrate with a first diffusion barrier layer, overcoating said layer with an overlay coating of a refractory material, and overcoating the refractory overlay coating with an etchable second diffusion barrier, forming a window-defining spacing pattern at the outer surface of said first diffusion barrier in the form of a narrow surface band to define adjacent first and second window areas on opposite sides of said band with the band having a different etch resistance characteristic relative to said adjacent first and second window surface areas, the so formed window surface areas retaining only said first diffusion barrier layer and having boundaries defined by the refractory layer of said band, forming a mask over a first one of said first and second window areas, said masking having a boundary extending into the surface are of said spacing pattern while leaving the second of said first and second window areas unmasked, etching the semiconductive substrate with an etchant which is blocked by said mask and spacing pattern to effectively etch the first diffusion barrier layer from said second one of said window areas, altering the conductivity of said substrate in a limited depth surface layer thereof located at said second window area, removing said mask, and applying first and second spaced contacts to said first and second window areas respectively.

2. Process in accordance with claim 1 wherein, said electrical contact applying step comprises the formation of ohmic contacts at said window areas to form at least one diode device at the surface of said semiconductive substrate.

3. Process in accordance with claim 1 wherein, each of said first and second window areas is subjected to a conductivity altering process to form a P-I-N semiconductive device.

4. Process in accordance with claim 1 wherein, each of said first and second window areas is subjected to said masking forming and said conductivity altering steps in alternating time sequence with the other of said window areas.

5. Process in accordance with claim 1 wherein, said electrical contact applying step comprises, alternately masking each one of said window areas with a mask having a boundary extending into the surface area of said narrow band spacing pattern and applying a contact material to the other of said window areas.

6. Process in accordance with claim 1 wherein a plurality of said devices are formed in a single substrate.

7. Process in accordance with claim 6 wherein said window-spacing surface pattern is formed as a cross-hatched grid.

8. Process in accordance with claim 1 comprising the further and subsequent steps of building said contacts to self-supporting size and removing said substrate from the devices to form a beam lead construction of said device.

9. Process in accordance with claim 1 wherein said first diffusion barrier is a thermal oxide of the substrate material and the second diffusion barrier is a pyrolytically deposited oxide of the substrate material.

10. Process in accordance with claim 1 wherein said substrate material is silicon, said first and second diffusion barriers are silicon dioxide and said refractory material is silicon nitride.

* * * * *